(12) United States Patent
Patel et al.

(10) Patent No.: US 8,588,024 B2
(45) Date of Patent: Nov. 19, 2013

(54) STATIC MEMORY WITH SEGMENTED CLEAR

(75) Inventors: Manish Umedlal Patel, Karnataka (IN); Vikash, Karnataka (IN)

(73) Assignee: LSI Corporation, Milpitas, CA (US)

( * ) Notice: Subject to any disclaimer, the term of this patent is extended or adjusted under 35 U.S.C. 154(b) by 247 days.

(21) Appl. No.: 13/043,731

(22) Filed: Mar. 9, 2011

(65) Prior Publication Data

US 2012/0230143 A1    Sep. 13, 2012

(51) Int. Cl.
*G11C 8/00* (2006.01)

(52) U.S. Cl.
USPC ............. 365/230.06; 365/230.01; 365/230.08

(58) Field of Classification Search
USPC ...................... 365/230.06, 230.01, 230.08
See application file for complete search history.

(56) References Cited

U.S. PATENT DOCUMENTS

| | | | |
|---|---|---|---|
| 5,602,774 A * | 2/1997 | Elrabaa et al. | 365/177 |
| 5,717,638 A | 2/1998 | Kim | |
| 6,963,499 B2 | 11/2005 | Rimondi et al. | |
| 7,110,286 B2 * | 9/2006 | Choi et al. | 365/163 |
| 7,254,088 B2 * | 8/2007 | Kurumada et al. | 365/230.05 |
| 7,333,380 B2 | 2/2008 | Schoellkopf | |
| 7,821,831 B2 | 10/2010 | Lovett | |
| 8,395,963 B2 * | 3/2013 | Behrends et al. | 365/230.06 |
| 2009/0285010 A1 | 11/2009 | Tao et al. | |

\* cited by examiner

*Primary Examiner* — Pho M Luu

(57) ABSTRACT

A static memory system with multiple memory cell that, in response to a reset signal, simultaneously resets or clears a segment of the memory cells in the memory. Clearing the entire memory or a portion thereof is accomplished by sequencing though a subset of address bits while asserting the reset signal.

22 Claims, 4 Drawing Sheets

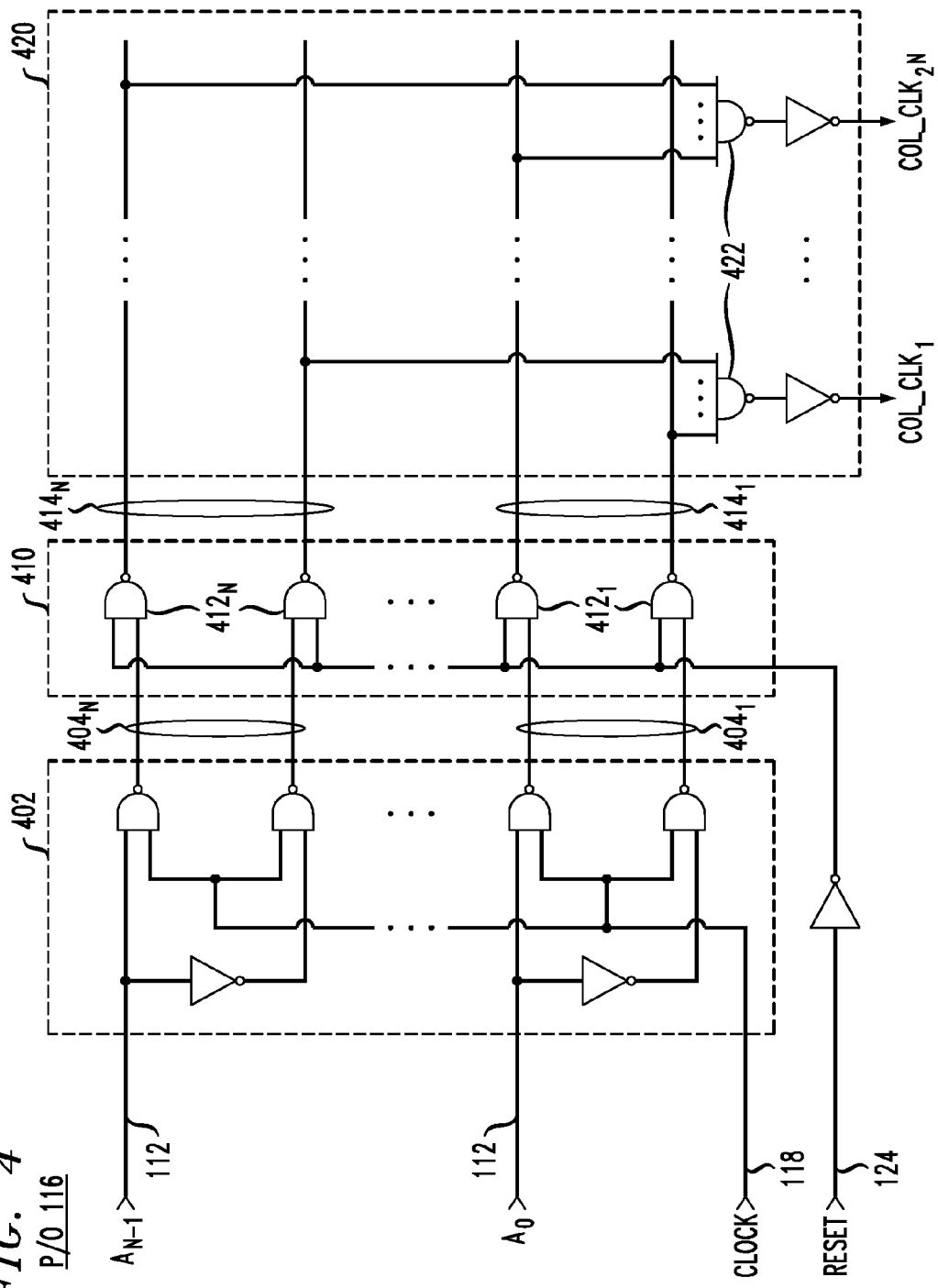

STATIC MEMORY WITH SEGMENTED CLEAR

BACKGROUND OF THE INVENTION

1. Field of the Invention

The present invention relates to memories generally and, more specifically, to static random access memories.

2. Description of the Related Art

Static random access memory (SRAM) is ubiquitous. It is used in everything from computer memory to digital watches. There are instances where it is desirable to clear the memory, i.e., write all zeros, into the memory. The typical approach is to sequentially write all, or a defined subset of all, of the memory cells to write predefined data, e.g., a zero, in those cells. While this will insure that those memory cells are cleared, significant amount of time might be required to individually access all of the memory cells to be cleared. An alternative approach is to "flash clear" the memory by simultaneously forcing all the memory cells into a predetermined state. One approach to implementing a flash clear is to simultaneously activate all of the word-lines in the memory and concurrently forcing all the bit-lines to reference voltage. One drawback for this approach is relatively high power supply current consumption that might significantly degrade the reliability of the chip due to electromigration of conductors on the chip and the high heat generated during the flash clear.

Another approach is disclosed in U.S. Pat. No. 7,333,380, incorporated herein by reference in its entirety. As shown in FIG. 1 of the patent, pull-down and/or pull-up of a memory cell latch is forced such that it alters data in a memory cell. Because ground is provided to a portion of the latch in each memory cell through an inverter (IVC), this approach has several drawbacks. For the portion of the latch driven by the inverter IVC, there are two series-connected transistors (one PMOS device in the inverter (not shown), and one NMOS device TN1) used during the clearing of the memory cell. At today's low operating voltages, e.g., less than 1 volt, clearing all of the memory cells might not be guaranteed due to an insufficient voltage (headroom) occurring on node ND1 to assure switching of transistors TN2 and TP2 to a desired state because of manufacturing variations in the electrical characteristics of the PMOS and NMOS devices in the memory cells.

Thus, it is desirable to provide a static memory design that allows for quickly clearing the memory while avoiding excessive power supply current consumption and remain functional at low operating voltages.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a memory system, comprising an array of memory cells arranged in rows of memory cells and columns of memory cells. Word-lines couple to corresponding ones of the rows of memory cells, write-lines couple to corresponding columns of memory cells, and a row address decoder couples to the word-lines and a row address input. Write drivers couple to corresponding ones of the write-lines, and a column address decoder couples to the write drivers and a column address input. The row decoder is adapted to activate at least one of the word-lines in response to a row address, and memory cells coupled to an activated word-line are enabled memory cells. The column address decoder is adapted to enable at least one of the write drivers, in accordance with a first column address on the column address input, to write desired data into enabled ones of the plurality of memory cells, and is further adapted to enable a plurality of the write drivers, selected in accordance with a second column address on the column address input and in response to a reset input, to write a preselected data value into enabled ones of the plurality of memory cells. The first column address has a first bit-width and the second column address has a second bit width, the first bit width being greater than the second bit width.

In an alternative embodiment, a method of clearing a memory is described. The memory comprises an array of memory cells arranged in rows of memory cells and columns of memory cells; word-lines coupling to corresponding ones of the rows of memory cells; write-lines coupling to corresponding columns of memory cells; a row address decoder, coupled to the word-lines and a row address input, adapted to activate at least one of the word-lines in response to a row address; write drivers coupled to corresponding ones of the write-lines; and a column address decoder coupled to the write drivers and a column address input. The method of clearing the memory comprises the steps of receiving a row address on the row address input; activating, by the row decoder, at least one word-line to enable memory cells coupled thereto; enabling, by the column address decoder, a plurality of the write drivers selected in accordance with a column address on the column address input and in response to a reset input; and writing, by the enabled write drivers, a preselected data value into enabled ones of the plurality of memory cells.

In still another embodiment, an array of memory cells is arranged in rows of memory cells and columns of memory cells. Word-lines couple to corresponding rows of memory cells, write-lines couple to corresponding columns of memory cells. A row address decoder, coupled to the word-lines and a row address input, is adapted to activate one of the word-lines in response to a row address having a first bit width on the row address input such that memory cells coupled to an activated word-line are enabled memory cells. Write drivers couple to corresponding ones of the write-lines, and a column address decoder couples to the write drivers and a column address input. The row address decoder is further adapted to enable a plurality of the word-lines in response to a row address having a second bit width on the row address input. The column address decoder is adapted to enable at least one of the write drivers, in accordance with a column address on the column address input, to write desired data into enabled ones of the plurality of memory cells, and is further adapted to enable at least one of the write drivers, selected in accordance with the column address and in response to a reset signal, to write a preselected data value into enabled ones of the plurality of memory cells. The first row address has a first bit-width and the second row address has a second bit width, the first bit width being greater than the second bit width.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 4 is a simplified schematic diagram illustrating an exemplary column decoder for the memory of FIG. 1 according to an embodiment of the invention.

DETAILED DESCRIPTION

Figure 1:
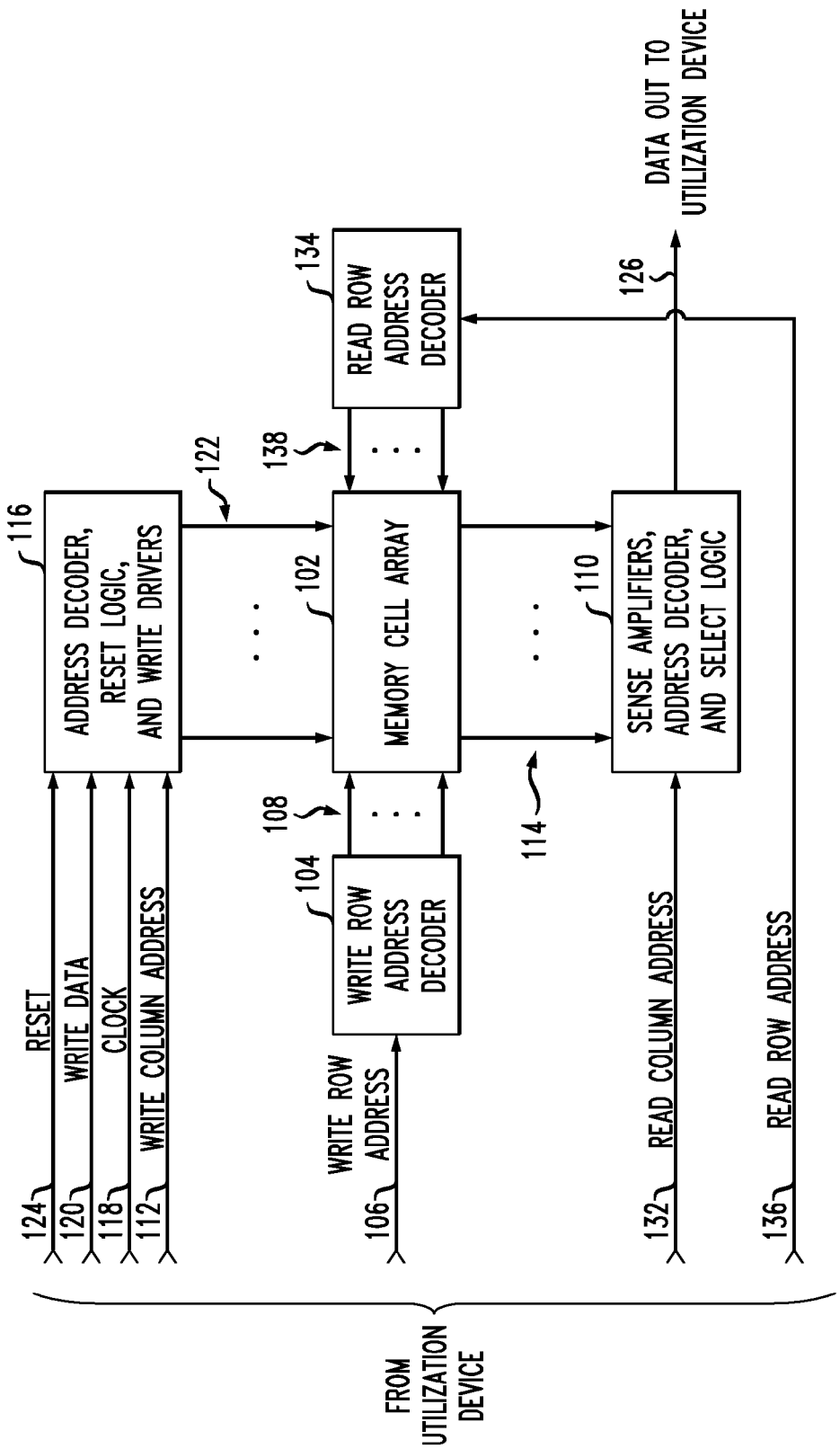
FIG. 1 shows a block diagram of a static random access memory in accordance with exemplary embodiments of the invention.

In FIG. 1, a block diagram of an exemplary static memory 100 according to embodiments of the invention is illustrated. It is understood that this exemplary embodiment operates asynchronously for reads and synchronously for writes, i.e., in response to an applied clock signal, and can be implemented as either a fully synchronous memory or a fully asynchronous memory. The memory 100 is generally embedded as part of a larger system, integrated circuit, or utilization device, such as a packet processor or video graphics system that typically includes a microprocessor or the like, but can be implemented as a stand-alone subsystem.

The memory 100 comprises a memory cell array 102, containing rows and columns of memory cells discussed in more detail below in connection with FIG. 2. The memory cell array 102 contains, in this example, $2^M$ rows of memory cells and $2^N$ columns of memory cells (M and N are integers greater than zero). It is understood that less than $2^M$ rows of cells and less than $2^N$ columns of cells may be implemented, as required, and N may equal M. In an embodiment, a write row address decoder 104, responsive to M-bit write row address input 106 (i.e., the input 106 has a bit-width of M bits), is of a conventional design that activates one of $2^M$ write word-lines 108. In an alternative embodiment and as will be explained in more detail below, multiple word-lines 108 may be activated at the same time when clearing data in the memory cell array 102.

To read data stored in the memory cell array 102 to output 126, a block 110 and a read row decoder 134 is provided. The block 110 comprises sense amplifiers, a column address decoder, and select or multiplexer logic. It is of a conventional design, utilizing, in one embodiment, inverters as sense amplifiers for data on bit-lines 114 from enabled memory cells in the array 102, and a conventional decoder for decoding an N-bit read column address input 132 (i.e., the input 132 has a bit-width of N bits) for selecting which bits from the sense amplifiers the select logic will couple to the output 126. Similar to the write row decoder 104, the read row address decoder 134, responsive to M-bit read row address input 136 (i.e., the input 136 has a bit-width of M bits), is of a conventional design that activates one of $2^M$ read word-lines 138.

To write data into the memory cell array 102, a block 116 comprising a column address decoder, write drivers, and reset logic is provided. As will be discussed in more detail in connection with FIGS. 3 and 4, block 116 decodes an N-bit column address input 112 (i.e., the input 112 has a bit-width of N bits), and in response to a clock or enable input 118, writes data from write data input 120 into enabled ones of the memory cells in array 102 via write-lines 122. In one embodiment, the reset logic, in response to reset input 124, simultaneously clears a segment of the memory cells in array 102, which segment of the memory cells that is cleared is at least partially determined by a subset of the row and column address bits on inputs 102 and 112, respectively. While the term "clear" is used to describe what happens to the memory cells when the reset input 124 is asserted, it is understood that either a logic one or zero may be written into the cells. Generally and for purposes here, clearing a memory cell results in a logic zero or logic low asserted on output 126 when a cleared memory cell is read.

In another embodiment of the memory 100 and as will discussed in more detail below, the write-lines 122 are also used for reading data from the memory array 102 by having the write-lines 122 additionally couple to the block 110 and the bit-lines 114 not present.

Because this embodiment of the memory 100 has one set of address inputs (row and column) for writing and another set for reading, the memory 100 is considered to have two ports, commonly referred to as a 1R1W memory. In another embodiment, a common row and a common column address is provided for both writes and reads, making the memory a simple one-port memory, commonly referred to as a 1RW memory, and may have write data input 120 in common with output 126. In still another embodiment, separate row decoders and word-lines for read and write are merged.

Figure 2:
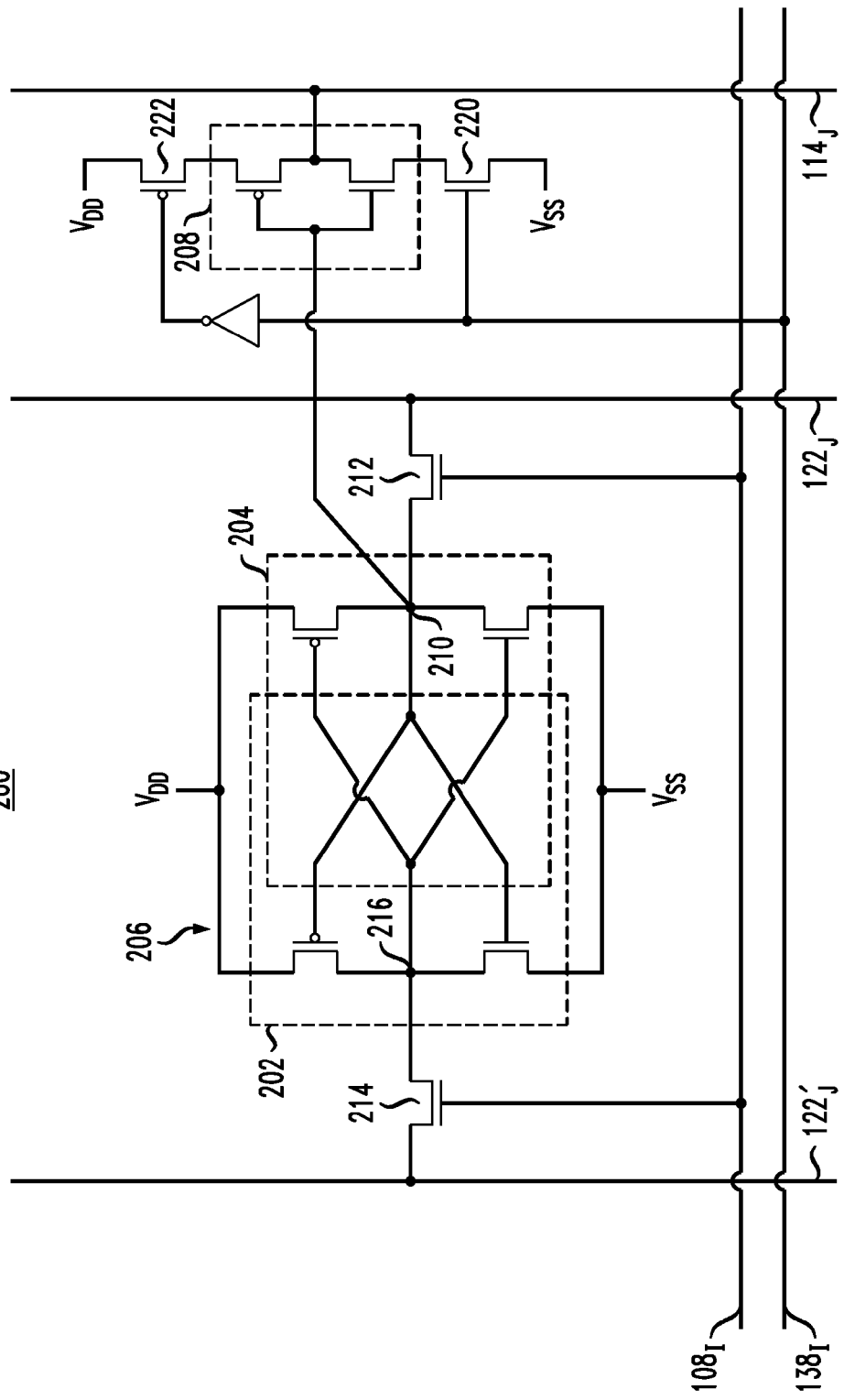
FIG. 2 is a simplified schematic diagram illustrating an exemplary memory cell in the memory of FIG. 1.

Turning to FIG. 2, an exemplary static memory cell $200_{I,J}$ (where $1 \le I \le 2^M$ and $1 \le J \le 2^N$, I and J are integers) is illustrated and coupled to write word-line $108_I$, read word-line $138_I$, bit-line $114_J$, and write-lines $122_J$, $122_J'$ arraigned as write-line pairs. In an embodiment, the memory cell $200_{I,J}$ is of a conventional design having two cross-coupled inverters 202 and 204, thereby forming a latch 206. As shown, this type of memory cell allows for the memory 100 (FIG. 1) to operate asynchronously, i.e., no clock is needed to read data from the cell. In another embodiment, the memory cell $200_{I,J}$ is configured such that the memory 100 is a synchronous memory in which data is read by precharging the bit lines $114_J$ and an enabled memory cell discharges the corresponding bit line. Such a memory cell might be simpler than that shown in FIG. 2 and is well known in the art.

To write data into the memory cell $200_{I,J}$, access transistors 212 and 214 are enabled when the write word-line $108_I$ is activated, e.g., "high", coupling nodes 210 and 216 to write-lines $122_J$ and $122_J'$, respectively. When the write-line pair is activated by having complementary data on write-lines $122_J$ and $122_J'$, the latch 206 is forced to accept the write data. When no write is to occur, such as during a read or when the memory is idle, the write-line pair is disabled by having both write-lines $122_J$, $122_J'$ "high", as will be discussed in more detail in connection with FIG. 3.

To read data stored in the memory cell $200_{I,J}$, amplifier 208 is enabled when a "high" is asserted on the read word-line $138_I$, thereby transmitting the inverse of the logic state on node 210 to the bit-line $114_J$. In this embodiment, the amplifier 208 is enabled when transistors 220 and 222 are both conductive in response to a "high" on read word-line $138_I$. N-channel transistor 220 is conductive when read word-line $138_I$ is "high" and P-channel transistor 222 is conductive because the output of inverter 224 is "low" when the read word-line is "high". When read word-line $138_I$ is "low", both transistors 220 and 222 are non-conductive. In another embodiment, bit-line $114_J$ and read word-line $138_I$ are absent and data is read from the cell utilizing the write-lines $122_J$, $122_J'$ as is well understood in the art.

Figure 3:
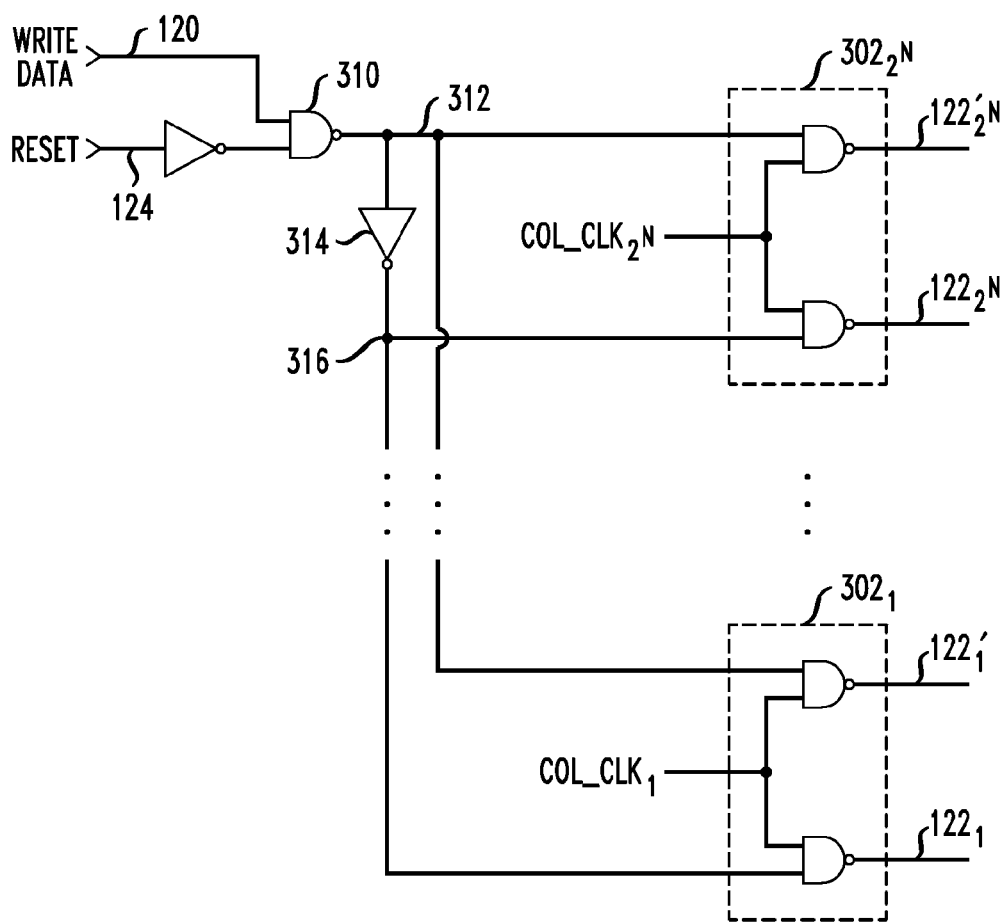
FIG. 3 is a simplified schematic diagram illustrating an exemplary bit-line driver for the memory of FIG. 1 according to an embodiment of the invention.

FIGS. 3 and 4 illustrate an exemplary embodiment of the block 116 of FIG. 1. FIG. 3 is an exemplary implementation of the write drivers used to drive the write-lines 122. In one embodiment, write drivers $302_1$-$302_2^N$ drive corresponding write-lines $122_1$, $122_1'$-$122_2^N$, $122_2^{N'}$. Each write driver has two NAND gates (not numbered) driven by a common enable signal $COL\_CLK_1$-$COL\_CLK_2^N$ that is used to select which of the write drivers will be enabled, as will be discussed in more detail in connection with FIG. 4. For purposes here, an enabled write driver "activates" the corresponding write-line pair when one of the write-lines of the activated write-line pairs is a logical "low" or a "zero", while the other write-line are a logical "high" or a "one". When disabled (the corresponding COL_CLK signal is "low"), a write driver supplies a "high" to both of the corresponding write-lines, e.g., $122_1$, $122_1'$, such that a memory cell coupled to those write-lines will not change state, as discussed above. Data for writing into a memory cell on input 120 passes through NAND gate 310 onto line 312. Inverter 314 drives line 316 with the logical inverse of the logic values on line 312. The write drivers, when enabled (the corresponding $COL\_CLK_1$-$COL\_CLK_2^N$ signals are "high"), logic values on lines 312 and 316 are transmitted to the corresponding write-lines $122_1'$-$122_2^{N_1}$, $122_1$-$122_2^N$, respectively. As will be discussed in more detail below, when a reset on input 124 is asserted, NAND gate 310 forces a "high" value on line 312 and a "low" onto line 316 regardless of the write data on input 120, thereby clearing memory cells coupled to enabled write drivers and coupled to activated word-lines.

Exemplary circuitry for generating the enable signals $COL\_CLK_1$-$COL\_CLK_2^N$ is shown in FIG. 4. Pre-decoder 402 receives column address bits from input 112 and, in response to CLOCK (enable) signal on input 118, generates a partial decode of the address to intermediate output pairs $404_1$-$404_N$. The partial address decoder intermediate output pairs $404_1$-$404_N$ is coupled to reset logic block 410. As will be explained in more detail below and in one embodiment, when the reset input 124 is asserted, a subset of the output pairs $414_1$-$414_N$ from reset logic block 410, corresponding to partial address decoder output pairs $404_1$-$404_N$, are forced to a "high". The outputs $414_1$-$414_N$ couple to decoder logic 420 that, in turn, generates outputs $COL\_CLK_1$-$COL\_CLK_2^N$. The decoder logic 420 comprises what are effectively AND gates 422 having inputs coupled to selected ones of each of the output pairs $414_1$-$414_N$ to complete the decoding of the N-bit address on input 112. In this embodiment, the signals $COL\_CLK_1$-$COL\_CLK_2^N$ are "high" when activated, which, in turn, enables corresponding ones of the write drivers $302_1$-$302_2^N$ (FIG. 3).

To provide simultaneous clearing of memory cells when the reset input 124 is asserted, a subset of the output pairs $412_1$-$412_N$ of reset logic block 410 are forced "high", forcing the corresponding ones of the signals $COL\_CLK_1$-$COL\_CLK_2^N$ "high". This is achieved by having inputs of a subset of the NAND gates (e.g., $412_1$) in the reset logic block 410 coupled to the reset input 124, while the remainder of the NAND gates (e.g., $412_N$) have inputs tied to a fixed logical "one" or "high". For the output pairs $414_1$-$414_N$ forced "high" in response to the reset signal, a subset of the write drivers $302_1$-$302_2^N$ (FIG. 3) are concomitantly enabled. For example and for this embodiment, both outputs $414_1$, $414_1'$ will be forced "high" when reset is asserted regardless of the value of one or more of the column address bits on input 112, whereas which of the output $414_N$, $414_N'$ is forced "high" depends on the column address bit $A_{N-1}$ on input 112. Further, assuming for this example that only NAND gates $412_1$ are responsive to the reset signal, when reset is asserted the signals $COL\_CLK_1$ and $COL\_CLK_2$ (not shown) are forced "high", enabling write driver $302_1$ and driver $302_2$ (not shown), resulting in column address bit $A_0$ being treated as a "don't-care" for purposes of clearing the memory. Thus, fewer address bits (e.g., a smaller address bit-width) are needed for clearing the entire memory 100 than needed for reading or writing to the memory 100. Because the reset input 124 is also coupled to one input of the NAND gate 310 (FIG. 3) as described above, write-line pairs coupled to enabled ones of the write drivers $302_1$-$302_2^N$ are activated, e.g., write-line $122_1'$ is "high" and write-line $122_1$ is "low". This will result in the clearing all of the memory cells coupled to the activated write-line pairs and activated word-lines 108 as selected in response to the row address on input 106 (FIG. 1). In this embodiment, sequencing through all the row addresses and the subset of column addresses while the reset signal is asserted will clear all of the memory cells in the memory cell array 102 (FIG. 1). This arrangement allows for quickly clearing memory cells without drawing excessive power supply current consumption. In addition, the memory 100 remains functional at low operating voltages since the memory cells are written to using the same number of series-coupled transistors as existing, low operating-voltage techniques.

The embodiments shown in FIGS. 2-4 utilize NAND gates but other logic functions, e.g., NOR gates, may be used to implement the various functional blocks as is well known in the art.

While the reset function, in this embodiment, activates a subset of the write-lines $122_1$, $122_1'$-$122_2^N$ at the same time during a reset/clear, in other embodiments all of the reset logic gates in logic block 410 receive the reset signal, such that all of the column address bits on input 112 are ignored for a reset/clear. Further, in another embodiment, the row decoder 104 may also be responsive to the reset input 124 so that a plurality of the write word-lines are activated during a reset/clear. This allows for a segment of memory cells to be cleared as selected by a subset of the row address on input 106. In such an embodiment, a plurality of the write drivers might not be enabled when the reset signal is asserted.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts which have been described and illustrated in order to explain the nature of this invention might be made by those skilled in the art without departing from the scope of the invention as expressed in the following claims.

We claim:

1. A memory comprising:
   an array of memory cells arranged in rows of memory cells and columns of memory cells;
   word-lines coupling to corresponding ones of the rows of memory cells;
   write-lines coupling to corresponding columns of memory cells;
   a row address decoder, coupled to the word-lines and a row address input, adapted to activate at least one of the word-lines in response to a row address;
   write drivers coupled to corresponding ones of the write-lines; and
   a column address decoder, coupled to the write drivers and a column address input, having:
      a pre-decoder, coupled to the column address input;
      reset circuit responsive to a reset signal and coupled to the pre-decoder; and
      a decoder, coupled between the reset circuit and the write drivers;
   wherein memory cells coupled to an activated word-line are enabled memory cells;
   wherein the column address decoder is adapted to enable at least one of the write drivers, in accordance with a first column address on the column address input, to write desired data into enabled ones of the plurality of memory cells, and is further adapted to enable a plurality of the write drivers, selected in accordance with a second column address on the column address input and in response to the reset signal, to write a preselected data value into enabled ones of the plurality of memory cells;
   wherein first column address has a first bit-width and the second column address has a second bit width, the first bit width being greater than the second bit width; and
   wherein the pre-decoder partially decodes a column address on the column address input to form a plurality of intermediate outputs, each intermediate output corresponding to a bit of the column address input; the reset circuit forces more than one of the plurality of the intermediate outputs to an active state in response to the reset signal, and the decoder enables those write drivers corresponding to a logical combination of the enabled ones of the intermediate outputs.

2. The memory of claim 1, wherein the number of memory cells written to in response to the reset signal is less than all the array of memory cells.

3. The memory of claim 1, wherein the preselected data value is a logical "zero".

4. The memory of claim 1, wherein each of the intermediate outputs are a pair of intermediate outputs that, when enabled by the reset circuit, are both logic "high", and the logical combination is a logical AND.

5. The memory of claim 4, wherein the pre-decoder, in response to a clock signal, asserts a true and complement value of the corresponding column address bit onto the corresponding pair of intermediate outputs that otherwise are both logical "low".

6. The memory of claim 5, wherein the reset circuitry comprises a plurality of NAND gates disposed between the pre-decoder and the decoder, the reset signal coupled to inputs of two or more of the NAND gates.

7. The memory of claim 1, wherein each of the driver circuits is responsive to the reset signal and is coupled to a write data input adapted to have the desired data thereon, and wherein the enabled write drivers force the desired data on the write data input into enabled ones of the memory cells and, when the reset signal is asserted, to force the preselected data into enabled ones of the memory cells.

8. The memory of claim 1, further comprising:
   read word-lines coupling to corresponding ones of the rows of memory cells;
   bit-lines coupling to corresponding columns of memory cells;
   a read row address decoder, coupled to the read word-lines and a read row address input, adapted to activate at least one of the read word-lines in response to a read row address;
   a read column address decoder coupled to a column address input; and
   sense amplifiers, coupled to the bit lines and responsive to the read column address decoder;
   wherein memory cells coupled to an activated read word-line are read-enabled memory cells;
   wherein data read from the read-enabled memory cells are amplified by the corresponding sense amplifiers and passed to an output of the memory in accordance with the read column address on the read column address input.

9. The memory of claim 8, wherein the read row address input and the write row address inputs are the same and the write row decoder performs the function of the read row decoder, and the word-lines serve as the read word-lines.

10. The memory of claim 1, wherein the memory is fabricated in an integrated circuit.

11. A memory comprising:
   an array of memory cells arranged in rows of memory cells and columns of memory cells;
   word-lines coupling to corresponding rows of memory cells;
   write-lines coupling to corresponding columns of memory cells;
   a row address decoder, coupled to the word-lines and a row address input, adapted to activate one of the word-lines in response to a row address having a first bit width on the row address input;
   write drivers coupled to corresponding ones of the write-lines; and
   a column address decoder, coupled to the write drivers and a column address input, having:
      a pre-decoder, coupled to the column address input;
      reset circuit responsive to a reset signal and coupled to the pre-decoder; and
      a decoder, coupled between the reset circuit and the write drivers;
   wherein memory cells coupled to an activated word-line are enabled memory cells;

wherein the row address decoder is further adapted to enable a plurality of the word-lines in response to a row address having a second bit width on the row address input;

wherein the column address decoder is adapted to enable at least one of the write drivers, in accordance with a column address on the column address input, to write desired data into enabled ones of the plurality of memory cells, and is further adapted to enable at least one of the write drivers, selected in accordance with the column address and in response to the reset signal, to write a preselected data value into enabled ones of the plurality of memory cells;

wherein first row address has a first bit-width and the second row address has a second bit width, the first bit width being greater than the second bit width, and wherein the pre-decoder partially decodes a column address on the column address input to form a plurality of intermediate outputs, each intermediate output corresponding to a bit of the column address input; the reset circuit forces more than one of the plurality of the intermediate outputs to an active state in response to the reset signal, and the decoder enables those write drivers corresponding to a logical combination of the enabled ones of the intermediate outputs.

12. The memory of claim 11, wherein the number of memory cells written to in response to the reset signal is less than all the array of memory cells.

13. The memory of claim 11, wherein the preselected data value is a logical "zero".

14. The memory of claim 11, wherein each of the intermediate outputs are a pair of intermediate outputs that, when enabled by the reset circuit, are both logic "high", and the logical combination is a logical AND.

15. The memory of claim 11, wherein the pre-decoder, in response to a clock signal, asserts a true and complement value of the corresponding column address bit onto the corresponding pair of intermediate outputs that otherwise are both logical "low".

16. The memory of claim 15, wherein the reset circuitry comprises a plurality of NAND gates disposed between the pre-decoder and the decoder, the reset signal coupled to inputs of two or more of the NAND gates.

17. The memory of claim 11, wherein each of the driver circuits is responsive to the reset signal and is coupled to a write data input adapted to have the desired data thereon, and wherein the enabled write drivers force the desired data on the write data input into enabled ones of the memory cells and, when the reset signal is asserted, to force the preselected data into enabled ones of the memory cells.

18. The memory of claim 11, further comprising:
read word-lines coupling to corresponding ones of the rows of memory cells;
bit-lines coupling to corresponding columns of memory cells;
a read row address decoder, coupled to the read word-lines and a read row address input, adapted to activate at least one of the read word-lines in response to a read row address;
a read column address decoder coupled to a column address input; and
sense amplifiers, coupled to the bit lines and responsive to the read column address decoder;
wherein memory cells coupled to an activated read word-line are read-enabled memory cells;
wherein data read from the read-enabled memory cells are amplified by the corresponding sense amplifiers and passed to an output of the memory in accordance with the read column address on the read column address input.

19. The memory of claim 18, wherein the read row address input and the write row address inputs are the same and the write row decoder performs the function of the read row decoder, and the word-lines serve as the read word-lines.

20. The memory of claim 11, wherein the memory is fabricated in an integrated circuit.

21. In a memory comprising:
an array of memory cells arranged in rows of memory cells and columns of memory cells;
word-lines coupling to corresponding ones of the rows of memory cells;
write-lines coupling to corresponding columns of memory cells;
a row address decoder, coupled to the word-lines and a row address input, adapted to activate at least one of the word-hues in response to a row address;
write drivers coupled to corresponding ones of the write-lines;
a pre-decoder, coupled to a column address input;
reset circuit responsive to a reset signal and coupled to the pre-decoder; and
a decoder, coupled between the reset circuit and the write drivers;
a method of clearing the memory comprising the steps of:
receiving a row address on the row address input;
partially decoding, by the pre-decoder, a column address on the column address input to form a plurality of intermediate outputs, each intermediate output corresponding to a bit of the column address input;
forcing, by the reset circuit, more than one of the plurality of the intermediate outputs to an active state in response to the reset signal;
activating, by the row decoder, at least one word-line to enable memory cells coupled thereto;
enabling, by the decoder, those write drivers corresponding to a logical combination of the enabled ones of the intermediate outputs; and
writing, by the enabled write drivers, a preselected data value into enabled ones of the plurality of memory cells.

22. The memory of claim 21, wherein the memory is fabricated in an integrated circuit.

* * * * *